United States Patent
Chen et al.

(10) Patent No.: US 6,325,948 B1
(45) Date of Patent: Dec. 4, 2001

(54) WAFERLESS CLEAN PROCESS OF A DRY ETCHER

(75) Inventors: Ta-Chin Chen, Hsinchu; Wen-Ruey Chang, Taipei; Hsew-Chu Hsu, Yunlin; Ming-Je Huang, Taipei; Sheung Kan Tsang, Tainan; Yuk Hong Ting, Hsinchu, all of (TW)

(73) Assignee: Lam Research Co., Ltd., Hsinchu (TW)

( * ) Notice: Subject to any disclaimer, the term of this patent is extended or adjusted under 35 U.S.C. 154(b) by 0 days.

(21) Appl. No.: 09/399,359

(22) Filed: Sep. 20, 1999

(30) Foreign Application Priority Data

Jul. 12, 1999 (TW) .................................................. 88111754

(51) Int. Cl.$^7$ .................................................... H01L 21/00

(52) U.S. Cl. ................................ 216/67; 134/31; 134/1.1; 216/79; 438/710

(58) Field of Search ................................... 134/1.1, 2, 31; 216/58, 67, 79; 156/345 P; 438/710

(56) References Cited

U.S. PATENT DOCUMENTS

| | | | |
|---|---|---|---|
| 5,294,262 | * 3/1994 | Nishimura | 216/67 X |
| 5,679,214 | * 10/1997 | Kuo | 134/1.1 X |
| 5,679,215 | * 10/1997 | Barnes et al. | 216/67 X |
| 5,756,400 | * 5/1998 | Ye et al. | 438/710 |

* cited by examiner

Primary Examiner—William A. Powell
(74) Attorney, Agent, or Firm—Sughrue, Mion, PLLC

(57) ABSTRACT

A waferless cleaning process of a dry etcher in semiconductor field, comprises the steps of: removing a batch of production wafers out of the chamber of the dry etcher, automatically starting waferless plasma cleaning to clean the chamber when at least a process factor reaches a preset condition, and loading next batch of production wafers into the chamber to undergo a normal production procedure. The process extends the meantime between wet clean (MTBC), prevents high particle counts, stabilizes the chamber condition, and improves process performance, tool uptime and throughput. The invention is characterized by not requiring any dummy wafers. Thus, the present invention does not need an operator. Besides, the present invention is capable of mixing different types of products.

9 Claims, 6 Drawing Sheets

WAFERLESS CLEAN PROCESS OF A DRY ETCHER

BACKGROUND OF THE INVENTION

1. Field of the Invention

The present invention relates to a waferless clean process and, more particularly to a waferless automatic clean process for cleaning a reaction chamber of dry etchers in semiconductor manufacturing processes.

2. Description of the Related Art

Many conventional etching machines cause byproducts to deposit on the surfaces of the reaction chamber to form particles. The particles will contaminate a wafer being produced and thus a defection wafer is produced. Thus, after a period of production, wet cleaning the chamber by a chemical solution is necessary. However, wet cleaning the chamber is time-consuming. To overcome this problem, a periodic plasma cleaning is usually used for cleaning the chamber and may extend MTBC (Mean Time Between Wet Clean).

The conventional plasma cleaning method includes: after a wafer produced in a reaction chamber, transporting the wafer from the reaction chamber to a loading dock; unloading the wafer from the loading dock by an operator; loading a plasma cleaning and seasoning dummy wafer to the loading dock by the operator and then to the chamber; plasma cleaning and seasoning the chamber, unloading the plasma cleaning and seasoning wafer from the chamber to the loading dock; unloading the plasma cleaning and seasoning wafer from the loading dock by the operator; and loading a monitoring wafer to the loading dock by the operator and then to the chamber.

The shortcomings of the conventional plasma cleaning method are:

a) The production of wafers is interrupted by an operator in order to perform the plasma cleaning, and thus downtime of the etcher is increased and the throughput is decreased.

b) Oxide wafers are used for cleaning, and blanket Si or poly dummy wafers are used for seasoning. The silicon of the dummy wafer will react with the fluoride to produce a gaseous silicon fluoride ($SiF_x$) to be dissipated and driven off by a pump, so that the reaction chamber is restored to the initial process conditions. Therefore, extra loading of providing oxide wafers, silicon wafers and poly wafers is imposed on a thin film module. Consequently, the cost is increased.

c) The MTBC is increased from 2000 RF minutes to 8000 RF minutes only (RF minutes stand for the time spent by a radio coil or the operation time of plasma cleaning).

The present invention provides a plasma cleaning method for a dry etcher without dummy wafers so as to overcome the above-mentioned disadvantages.

SUMMARY OF THE INVENTION

An object of the present invention is to provide a waferless cleaning process for a dry etcher, which is an automatic process and does not need operators.

A further object of the present invention is to provide a waferless cleaning process for a dry etcher, which does not require any seasoning wafers, can reduce dummy wafer usage, and the wafer cost and loading on a thin film module can be reduced.

Another object of the present invention is to provide a practical waferless cleaning process for a dry etcher, which can increase the MTBC from 8000 RF minutes to 20000 RF minutes.

Still another object of the present invention is to provide a waferless cleaning process for a dry etcher which can overcome the above-mentioned disadvantages and can reduce the downtime of the etcher and increase the throughput.

In order to achieve the above objects, the present invention discloses a waferless cleaning process for a dry etcher, comprising: removing a first batch of wafers out of a reaction chamber of a dry etcher; automatically starting waferless plasma cleaning to clean the reaction chamber when at least a process factor reaches a preset condition; loading a second batch of wafers into the chamber after the cleaning procedure is finished; and performing normal production procedures. The process factor could be a lot number or the number of wafers processed in the chamber.

In one of preferred embodiments, the waferless cleaning process of the present invention further includes a waferless recovery step in which at least a reactive gas is input and plasma cleaning at a power ranging from 400 watts to 900 watts is performed before the step of loading next batch of wafers into the chamber. The reactive gas used in the waferless recovery step could be halide gas or oxygen. In one of the preferred embodiments, the reactive gas is a gaseous fluoride. In another preferred embodiment, the waferless cleaning process of the present invention further includes an inert gas purge step between the steps of loading next batch of wafers into the chamber and the waferless recovery step.

The operation procedures are simplified as follows:

After production of a batch of wafers is finished, the wafers are removed out of the chamber to the loading dock. Meanwhile the etcher automatically starts waferless plasma cleaning. The operator unloads the wafers and then loads monitoring wafers to the loading dock. After cleaning, the monitoring wafers are loaded into the chamber immediately.

DETAILED DESCRIPTION OF THE INVENTION

Figure 1:
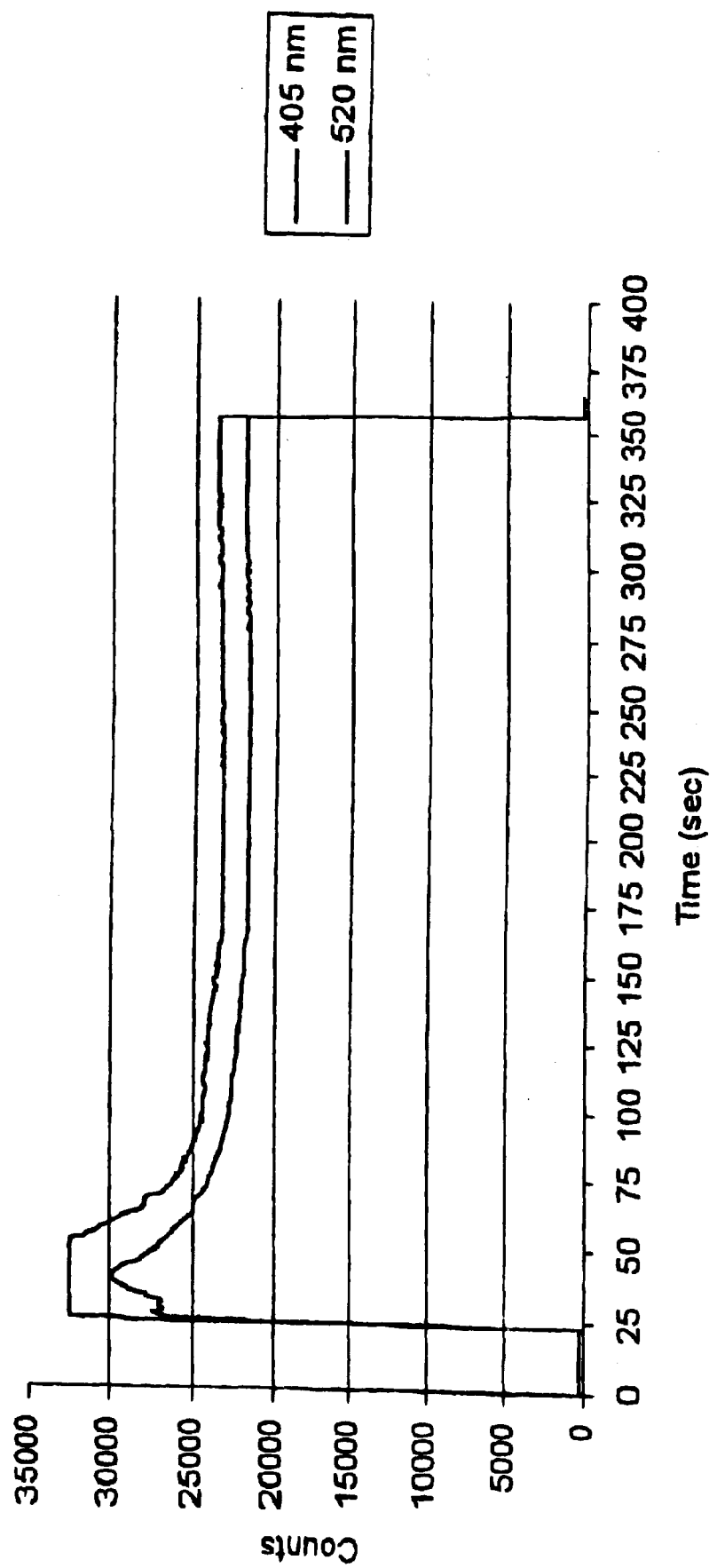
FIG. 1 depicts waferless auto cleaning (WAC) endpoint traces.

The embodiments of the present invention comprise three major steps: waferless auto cleaning (WAC), waferless recovery step (WRS) and inert gas purge such as He purge. The WAC is an effective step for extending the MTBC and preventing high particle counts because it does not require conventional dry cleaning that requires an operator and dummy wafers and can be applied frequently in use. Whether the WRS and He purge steps are added to the WAC step depends on process conditions: the etching rate, uniformity, remaining gate oxide, and CD bias. The addition of the WRS step is directed to minimizing the fluctuation of the process conditions.

1) WAC Recipe and Time

Since the walls of the chamber are not powered by an RF source, they encounter very little bias during a typical process. Thus, deposition easily occurs on the walls. Deposited particles on the walls must be cleaned by an isotropic chemical etching which needs fluorides. The WAC step is an effective and quick action for cleaning the chamber. The particles deposited on the walls of the chamber are removed by an isotropic chemical etching method in which a fluoride is used. Typical WAC process conditions are as follows:

Pressure: 10–15 m Torr
Plasma: TCP (Transformer Coupled Plasma) of 800 watts
$SF_6$: 100–150 s.c.c.m.
$Cl_2$: 20–50 s.c.c.m.
$O_2$: 20–50 s.c.c.m.
Time: 70 seconds The WAC process conditions will be slightly adjusted according to different applications so as to optimize cleaning efficiency. Oxygen is helpful to $SF_6$, $Cl_2$ dissociation, and isotropicaly dissociating carbon-based deposition.

The WAC step can be performed without any wafers. Please note that the bottom power should not be turned on during WAC. Otherwise, the electro-static chuck (ESC) will be damaged. The lower electrode could be protected during WAC. Because the WAC does not require any wafers, the production process will not be interrupted by operators to load wafers. In the interval between two transpositions of produced wafers to the loading dock, the WAC, WRS and He purge can be automatically performed so as to increase the uptime. Thus, throughput is increased. Furthermore, because production will not be interrupted and no dummy wafer is required, the waferless cleaning step of the present invention can be automatically performed at predetermined times and intervals. Therefore, the conventional cleaning step can be subdivided in terms of time and performed in these subdivided steps and thus the MTBC can be extended.

The duration of the WAC step is determined by applications. That is, the duration varies with the film thickness and conditions under which the etcher operates. The duration for thoroughly cleaning chamber by the WAC of the present invention can be estimated from the endpoint signal by using the endpoint wavelength monitor in the system. To trace the endpoint of the WAC step at the wavelengths of 405 nm and 520 nm shows a gradually flattening curve which indicates decreasing intensity of the signal when the chamber is cleaned. The decrease is because both the deposition during production and the removal of byproducts during the WAC are nonuniform processes. Besides, in some circumstances, it may be advantageous to perform a partial WAC, i.e. to partially clean the chamber.

As shown in FIG. 1, the endpoint traces are taken during a WAC which runs after 100 bare Si wafers are etched by using $CF_4$ etching, $Cl_2/HBr/He—O_2$ poly ME (Main Etching), and $HBr/He—O_2$ poly OE (Over Etching). A rough indication that the chamber is fully cleaned is that the endpoint traces are flat. In FIG. 1, this occurred at around 150 seconds. Below this value, we can call it "partial WAC"; otherwise, we call it "full WAC."

Figure 2:
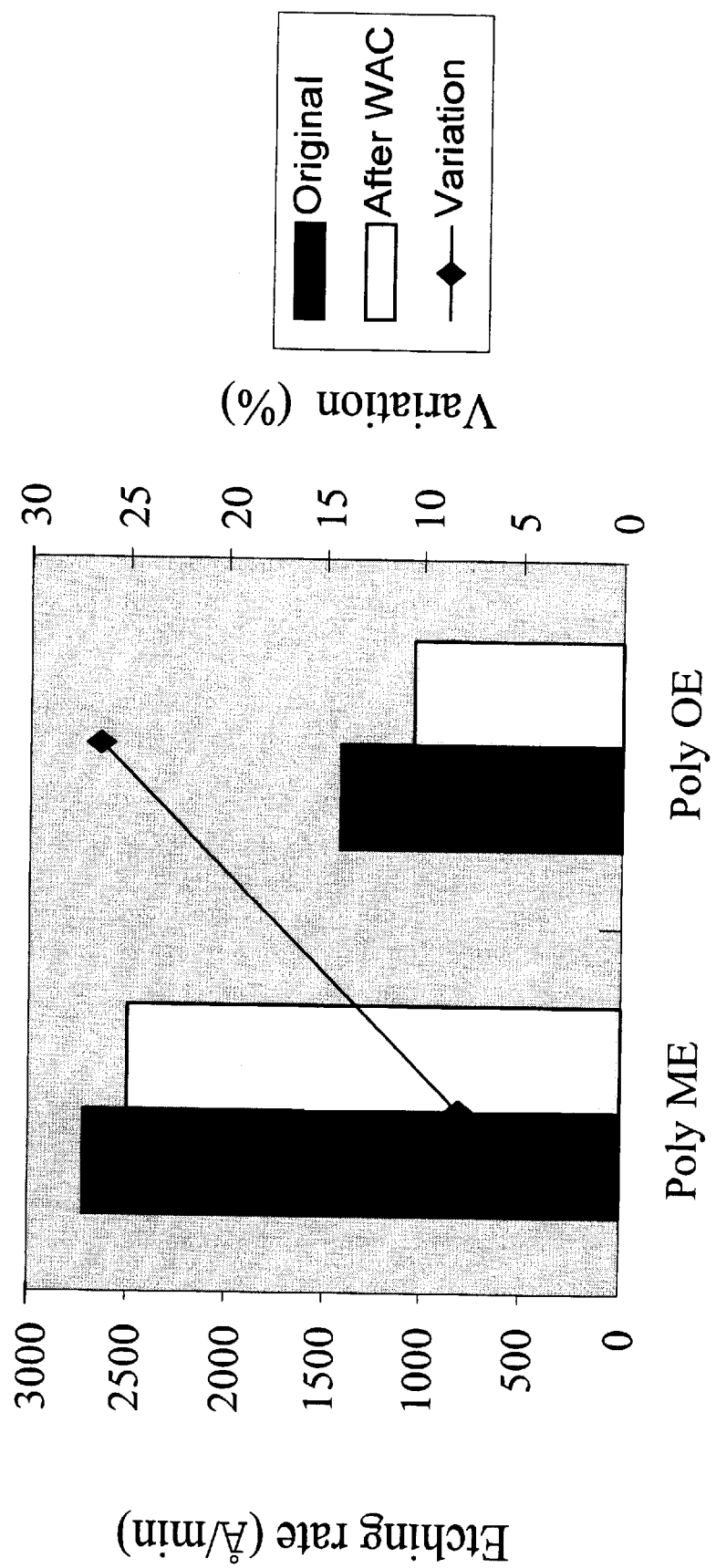
FIG. 2 depicts fluctuation in poly etching rates after WAC.

If the WAC is not followed by the WRS and He purge, the process conditions will change due to the fluoride remaining inside the chamber. FIG. 2 shows that the poly ER (etching rate) decreases after the WAC is performed for main and over etching steps. The experimental data is shown in Table 1. In order to prevent the ER from decreasing, it is better to run a recovery step after WAC.

TABLE 1

|  | Poly ME | Poly OE |
|---|---|---|
| original value (Å/min) | 2719 | 1424 |
| after WAC | 2499 | 1048 |
| variation (%) | 8.09 | 26.40 |

2) WRS (Waferless Recovery Step)

Fluorides $SF_6$ and $NF_3$ are the most effective gases in plasma cleaning the deposited byproducts. Since the fluorine F is the most electronegative element in the periodic table, residual fluorides are very hard to pump out after they are dry cleaned. The residual fluorides inside the chamber will affect the performance of the process. For example, the etching rate and/or selectivity will be shifted so that process conditions cannot be controlled easily. It is better to remove the residual fluorides before production. Therefore, how to remove the residual fluorides becomes the priority job of stabilizing the chamber conditions. It is desired to perform a recovery step after plasma cleaning.

The waferless recovery step is a waferless plasma step following the WAC to recover the process condition variation caused by the WAC. Typical WRS conditions are as follows:

Pressure: 10 m Torr
Plasma: TCP of 800 watts
$Cl_2$: 100 s.c.c.m.
HBr: 50–100 s.c.c.m.
$O_2$: 20–50 s.c.c.m.
Time: 60 seconds The $Cl_2$ and HBr are common gas for dry etchers and will not impose any loads on the WRS process. The $O_2$ will react with carbon compounds to generate carbon dioxide gas to be removed. Conventional recovery process utilizes silicon on the blanket Si wafers to react with fluorides, and the operation power should be kept from 250 watts to 300 watts. The present invention enhances the power of plasma in order to achieve the objects of physically removing fluorides and the operation power is from 400 watts to 900 watts. An optimum WRS process must serve two purposes. One is to achieve stable etching rates. The other is to remove as much fluoride as possible in order to protect the oxide gates.

Figure 3:
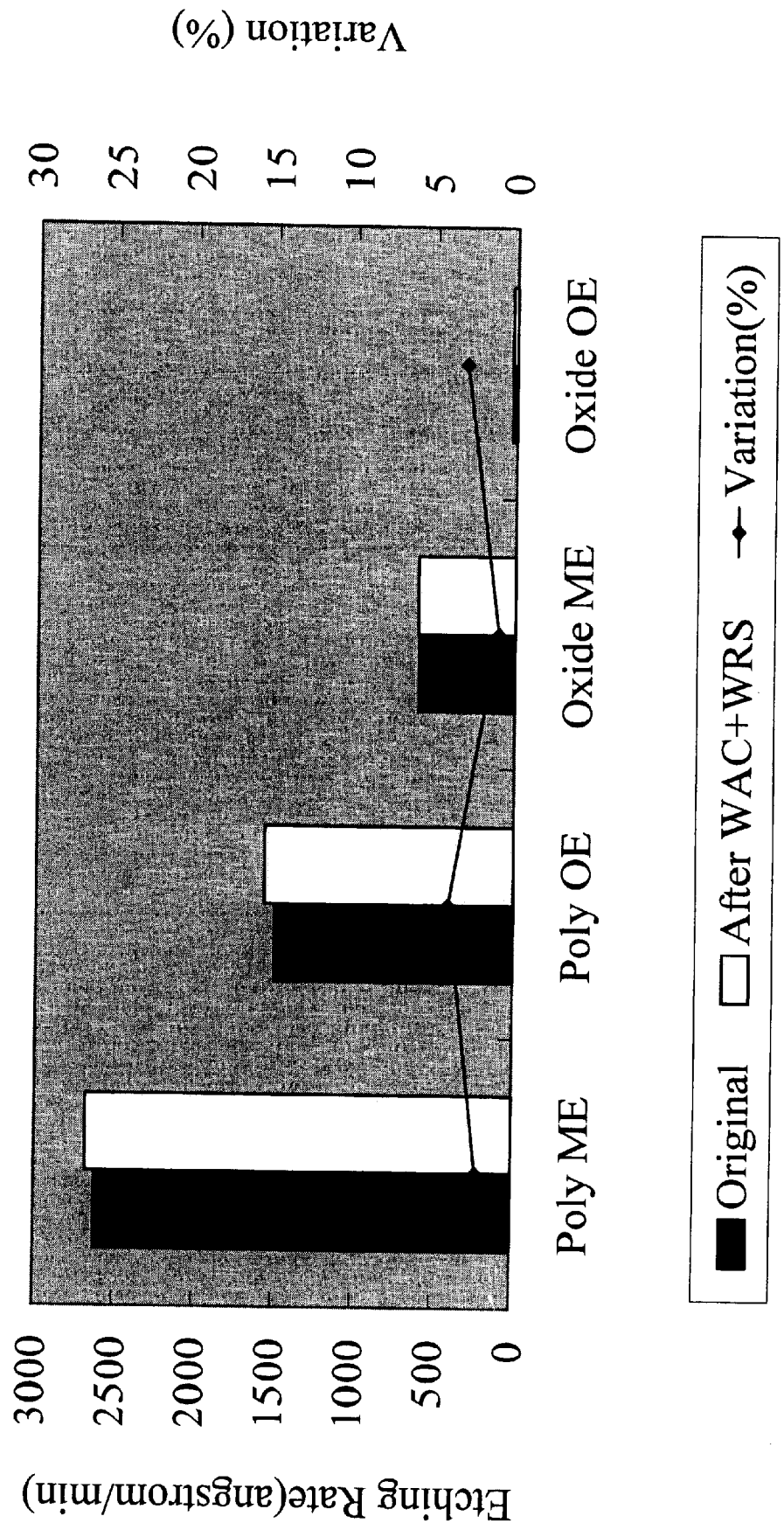
FIG. 3 depicts poly and oxide etching rate recovery after the WAC and waferless recovery step (WRS) are performed.

FIG. 3 depicts poly and oxide etching rate recovery by running WAC and WRS and the experimental data is shown in Table 2.

TABLE 2

|  | Poly ME | Poly OE | Oxide ME | Oxide OE |
|---|---|---|---|---|
| original value (Å/min) | 2620 | 1500 | 600 | 26.73 |
| after WAC + WRS | 2678 | 1561 | 606 | 27.56 |
| shift (%) | 2.21 | 4.06 | 3.1 |  |

The variation of the etching rate after WAC and WRS is less than 10%, and even less then 5%. This meets the requirement of most customer acceptable etching rate, which is ±10%.

Figure 4:
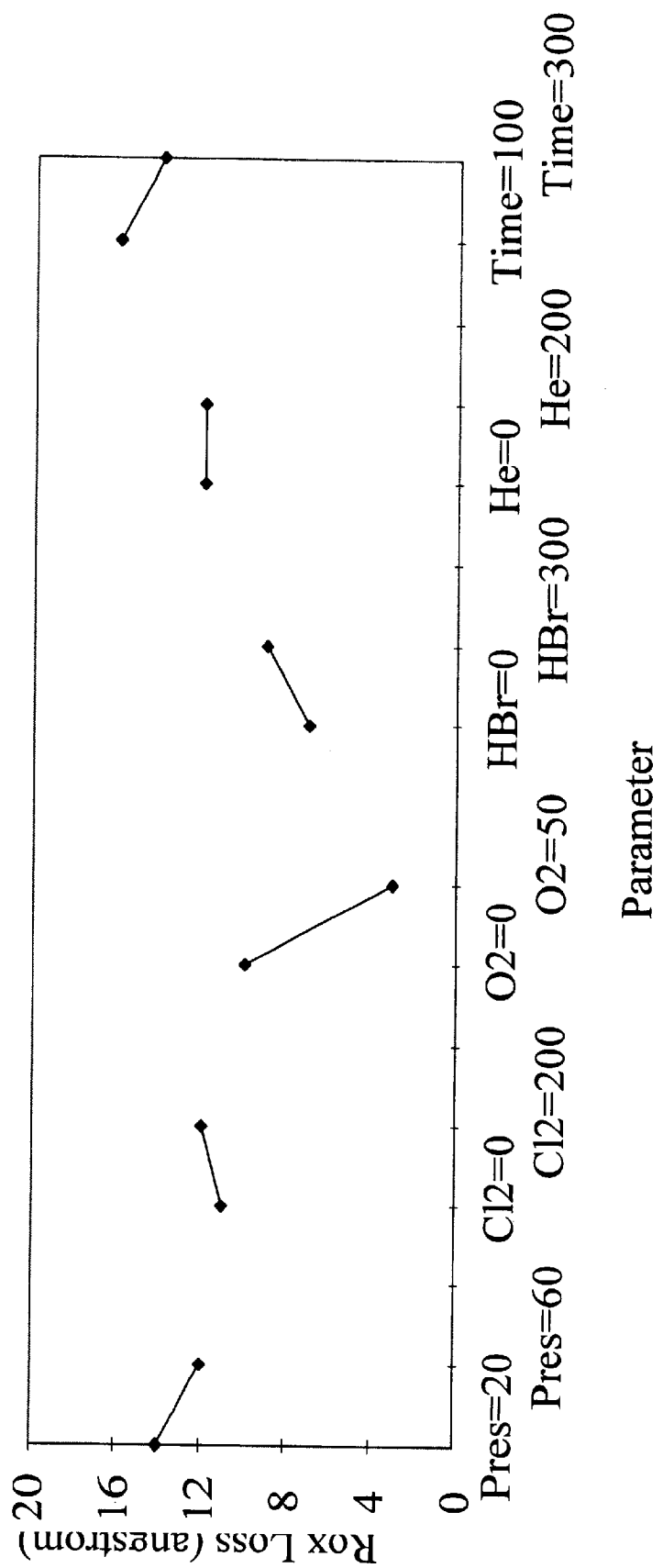
FIG. 4 depicts a matrix chart of relationships between WRS parameters and the thickness of lost oxide layer.

According to the relationship between various parameters and the thickness of a remaining gate oxide, optimum WRS conditions can be achieved. FIG. 4 depicts a matrix chart showing the relationship between the WRS parameters and the thickness of the lost gate oxide(Rox loss). Table 3 shows WRS parameter trends.

TABLE 3

| parameter | pressure | $Cl_2$ | $O_2$ | HBr | He | Time |
|---|---|---|---|---|---|---|
| Rox Loss increase | decrease | increase | decrease greatly | increase | not change | decrease |

For some applications, the process variation caused by WAC is acceptable when the requirements of etching rate and the thickness of the remaining gate oxide are not strict. Therefore, the WRS could be omitted in order to increase tool uptime and save costs.

3) Inert Gas Purge

If the WRS following the WAC can not fully recover the etching rate or remaining gate oxide, it is recommended that an inert gas such as helium is used. A typical He purge recipe is listed below.

Pressure: 0–10 m Torr

He: 200 s.c.c.m.

Time: 30–60 seconds

As mentioned above, the fluorides $NF_3$, $SF_6$ is the most effective purging substances for use in plasma cleaning. Since fluoride is one of the most electronegative compounds, it is hard to be removed. Fluorides in the chamber will cause unstable chamber conditions which in turn result in variations of etching rate, gate oxide loss or CD bias. An He purge is an extension of the WRS and can improve the gate oxide loss. The He purge after WRS can dilute the residual fluorides and gain remaining gate oxides. Table 4 shows that the remaining gate oxides are increased by adding the He purge step.

TABLE 4

| Plasma Cleaning | Thickness of Remaining Gate Oxide |
|---|---|
| WAC: 10mT/800TCP/150SF$_6$/20O$_2$/2OCl$_2$/70" WRS: 10mT/800TCP/100Cl$_2$/50HBr/150" | 21④ |
| WAC: 10mT/800TCP/150SF$_6$/20O$_2$/2OCl$_2$/70" WRS: 10mT/800TCP/100Cl$_2$/50HBr/150" He purge: 10mT/200He/60" | 25④ |

4) MTBC Extension and Uptime Improvement

Frequent use of WAC becomes the best way to remove deposition, reduce particle counts and extend MTBC because many of the etching applications on etchers cause the deposition of byproducts on the chamber wall surface and frequent waferless plasma cleaning can reduce particle counts and always keep chamber clean before the chamber wall is heavily deposited by byproducts. The MTBC for conventional plasma cleaning is 8,000 RF minutes. The MTBC for waferless plasma cleaning of the present invention is improved to 20,000 RF minutes.

For the conventional plasma cleaning, the operator needs to stop the production and loads dummy wafers. This loses much uptime and thus it is not convenient to run plasma cleaning frequently. The present invention improves the uptime by more than 5%. Since the dummy wafers are not required when the etcher automatically performs waferless plasma cleaning, the loading and unloading times and the human response time could be eliminated. Table 5 shows the improvement of throughput according to the present invention.

TABLE 5

| Application | Frequency | WAC impact on throughput | Conventional dry clean impact on throughput | Throughput improvement by WAC |
|---|---|---|---|---|
| Polycide process | every 25 pieces | 3% | 14% | 11% |
| Poly process | every 25 pieces | 3% | 8% | 5% |

5) Process Stability

Figure 5:
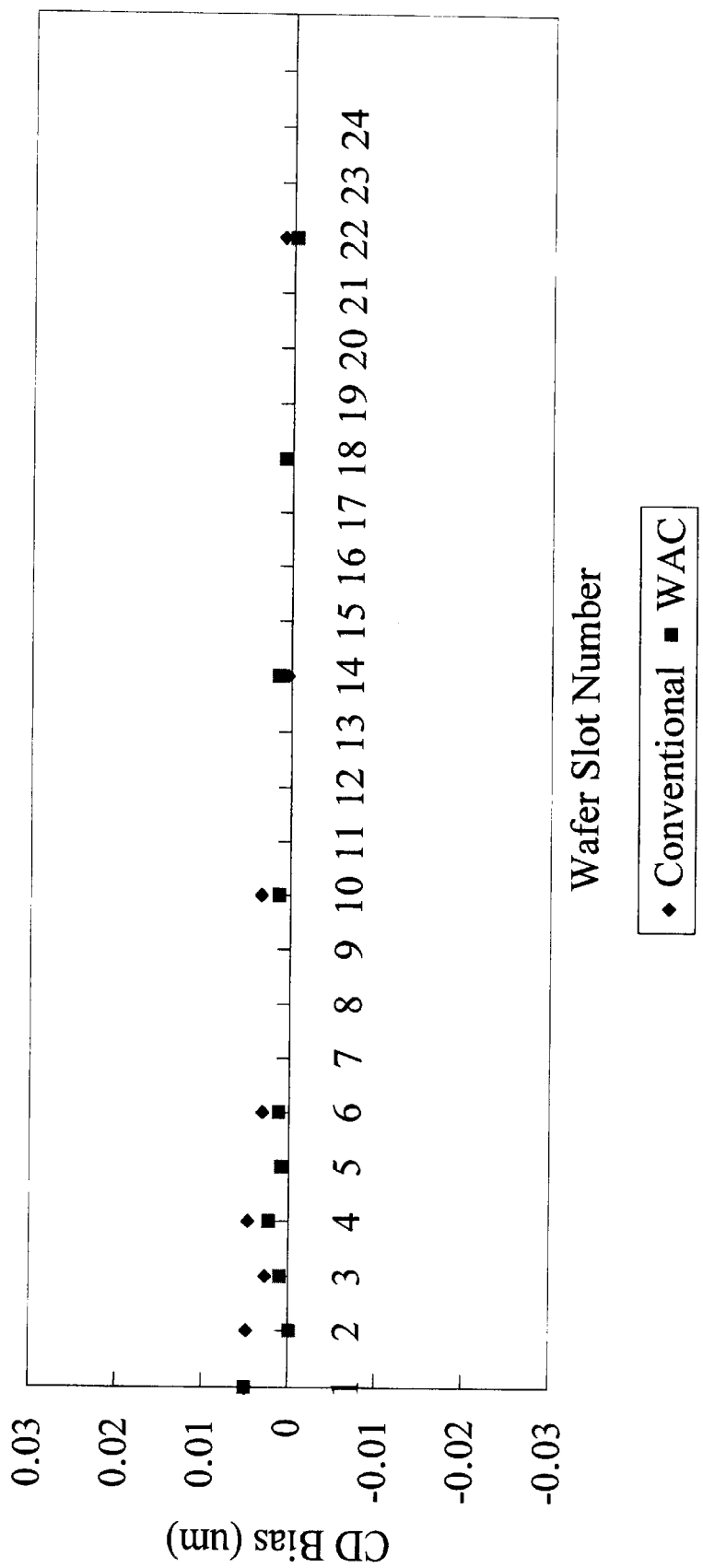
FIG. 5 is a chart showing the trend of the critical dimension (CD) bias of a 0.25 $\mu$m poly.
Figure 6:
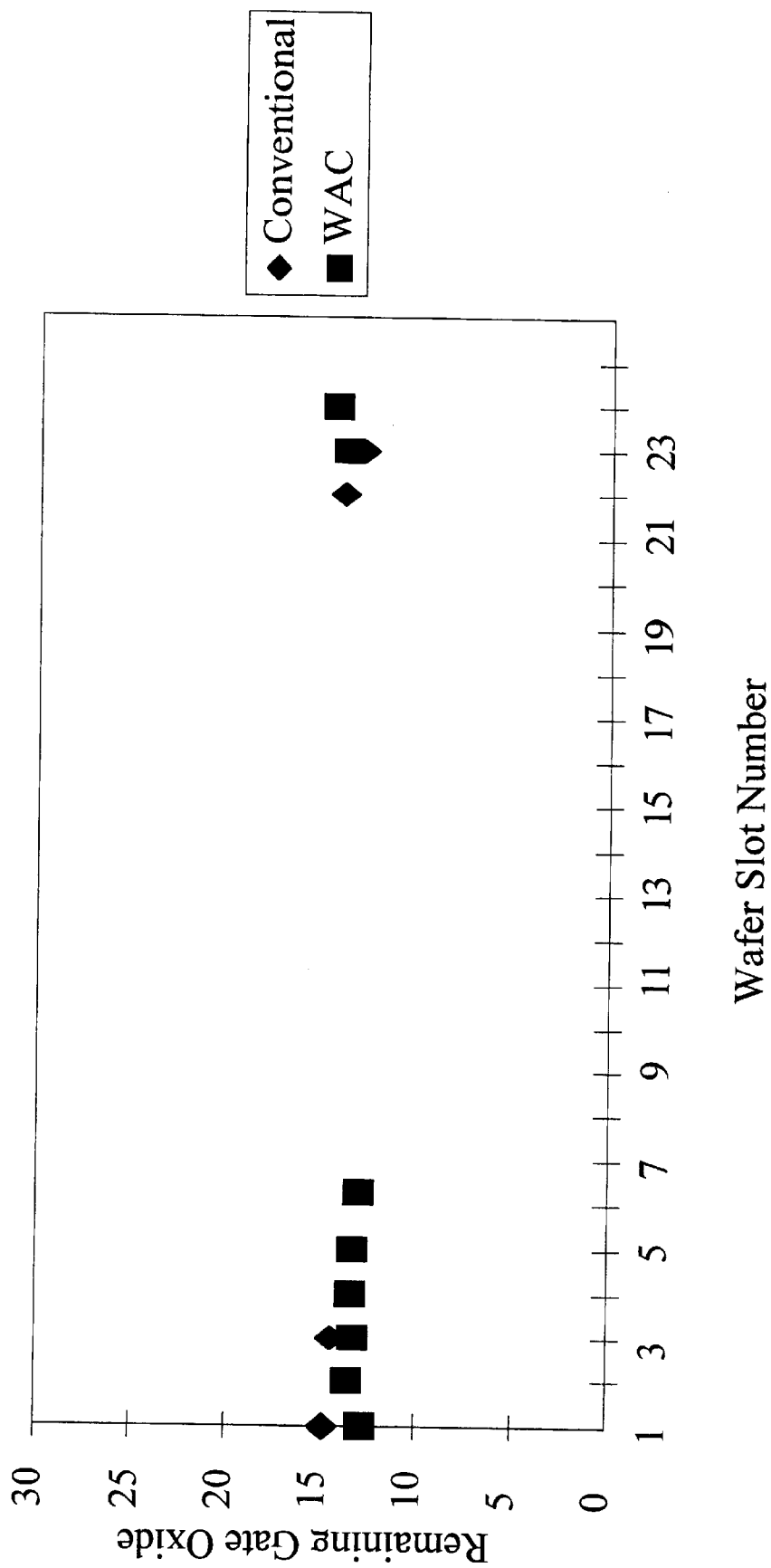
FIG. 6 is a chart showing remaining gate oxide of a 0.25 $\mu$m poly.

No matter how the uptime and MTBC are improved, the most important thing for the wafer fabricators is the process stability. There are two indexes for evaluating the process stability. One is CD bias, and the other one is remaining oxide. No matter WAC or WAC followed by WRS and He purge is used, the waferless cleaning process of the present invention provides stable process performance. As shown in FIG. 5, a trend of 0.25 µm poly application critical dimension, which shows (CD) bias, the CD bias of wafers in different slots but within the same wafer cassette according to the present invention is lower than that according to the conventional method. In FIG. 6, which shows a trend of 0.25 µm poly application remaining gate oxide, the remaining gate oxide of wafers in different slots but within the same wafer cassette is stable according to the present invention.

6) Mix Run Products

Particle contamination and chamber condition stability for etching become more and more critical as critical dimension shrinks to 0.25 µm and even smaller. After the waferless cleaning process of the present invention, the chamber conditions will return to the initial conditions in which the chamber is clear. When next wafer is transferred to the chamber, it faces a clean chamber condition as the previous wafers do. No matter how dirty the chamber is, the present invention can mix different types of product wafers to be produced.

With the disclosed invention, apparently numerous modifications and variations can be made without departing from the scope and spirit of the present invention. Therefore, the present invention is intended to be limited only as indicated in the following claims.

What is claimed is:

1. A waferless dry cleaning process of a dry etcher, the dry etcher having a reaction chamber, comprising the steps of:
   removing a batch of production wafers out of the reaction chamber of the dry etcher;
   automatically starting a waterless dry plasma cleaning process to clean the reaction chamber when at least a process factor reaches a condition; and
   loading a next batch of production wafers into the reaction chamber in order to undergo a normal production procedure.

2. A waferless dry cleaning processing of a dry etcher, the dry etcher having a reaction chamber, comprising the steps of:
   removing a batch of production wafers out of the reaction chamber of a dry etcher; automatically starting a waferless dry plasma cleaning process to clean the reaction chamber when at least a process factor reaches a condition; and
   loading a next batch of production wafers into the reaction chamber in order to undergo a normal production procedure,
   further including a waferless recovery step which comprises inputting at least a reactive gas and plasma cleaning under a power ranging from 400 watts to 900 watts before the step of loading a next batch of production wafers into the reaction chamber.

3. The waterless dry cleaning process of claim 2, wherein the reactive gas is a gaseous mixture of chlorine, bromide, and oxygen.

4. The waferless cleaning process of claim 2, further including the step of purging the chamber by an inert gas after the waferless recovery step.

5. The waferless cleaning process of claim 4, wherein the inert gas is helium.

6. The waferless cleaning process of claim 1, wherein the process factor is a lot number.

7. The waferless cleaning process of claim 1, wherein the process factor is the number of the production wafers processed in the chamber.

8. The waferless dry cleaning process of claim 2, wherein the process factor is a lot number.

9. The waferless dry cleaning process of claim 2, wherein the process factor is the number of the production wafers processed in the chamber.

* * * * *